US007250818B2

(12) United States Patent
Ayun et al.

(10) Patent No.: US 7,250,818 B2
(45) Date of Patent: Jul. 31, 2007

(54) RF POWER AMPLIFIER CIRCUIT AND RF TRANSMITTER AND TERMINAL INCLUDING IT

(75) Inventors: Moshe Ben Ayun, Shoham (IL); Ovadia Grossman, Tel Aviv (IL); Shay Nir, Holon (IL); Mark Rozental, Gedera (IL)

(73) Assignee: Motorola, Inc., Schaumburg, IL (US)

( * ) Notice: Subject to any disclaimer, the term of this patent is extended or adjusted under 35 U.S.C. 154(b) by 126 days.

(21) Appl. No.: 11/096,938

(22) Filed: Apr. 1, 2005

(65) Prior Publication Data

US 2006/0220739 A1    Oct. 5, 2006

(30) Foreign Application Priority Data

Apr. 2, 2004   (GB)   .................... 0407562.8

(51) Int. Cl.
*H03G 3/20*   (2006.01)
(52) U.S. Cl. .................... 330/140; 330/85; 330/297
(58) Field of Classification Search ............... 330/140, 330/297, 85
See application file for complete search history.

(56) References Cited

U.S. PATENT DOCUMENTS

| 4,547,746 | A | | 10/1985 | Erickson et al. | |
|---|---|---|---|---|---|
| 5,537,080 | A | * | 7/1996 | Chawla et al. | 330/266 |
| 6,148,220 | A | | 11/2000 | Sharp et al. | |
| 6,417,729 | B1 | * | 7/2002 | Lemay et al. | 330/129 |
| 6,774,718 | B2 | * | 8/2004 | Ichitsubo et al. | 330/129 |
| 6,825,725 | B1 | * | 11/2004 | Doherty et al. | 330/289 |
| 6,924,698 | B2 | * | 8/2005 | Camnitz et al. | 330/140 |
| 6,982,594 | B2 | * | 1/2006 | Snider et al. | 330/140 |

FOREIGN PATENT DOCUMENTS

EP    1349269 A1    10/2003

* cited by examiner

*Primary Examiner*—Patricia Nguyen
(74) *Attorney, Agent, or Firm*—Valerie M. Davies; Randi L. Karpinia

(57) ABSTRACT

A RFPA (radio frequency power amplifier) circuit (150) which includes a RFPA (101), a supply voltage source (104), means (155) for applying to the RFPA a gain control bias voltage and a feedback control loop (156) for adjusting a voltage applied to the RFPA, the feedback control loop including a sampler (107) for sampling an output of the RFPA, a RF detector (109) for detecting a level of RF power sampled by the sampler, a comparator (115) for comparing an output signal from the RF detector with a reference signal, an integrator (117) for integrating an output signal of the comparator and a voltage regulator (151) having a first input from the integrator and a second input from the supply voltage source and an output connected to the RFPA, the regulator being operable to apply to the RFPA a supply voltage adjusted in response to an input signal from the integrator.

14 Claims, 3 Drawing Sheets

RF POWER AMPLIFIER CIRCUIT AND RF TRANSMITTER AND TERMINAL INCLUDING IT

FIELD OF THE INVENTION

This invention relates to a RF (radio frequency) power amplifier ('RFPA') circuit and a RF transmitter and terminal including it. In particular, the invention relates to a RFPA for use in a constant envelope RF transmitter.

BACKGROUND OF THE INVENTION

Constant envelope RF transmitters are employed in some communications applications. Such transmitters may employ a RFPA to which power tuning is applied wherein the gain is adjusted according to the RF power level of the signal being transmitted. This is usually done as follows. The RFPA is in a circuit which includes means for applying to the RFPA a supply voltage and also means for applying to the RFPA a gain control bias voltage. The latter means includes a feedback control loop which includes a sampler for sampling an output of the RFPA, a controller comprising (a) a RF detector for detecting a level of RF power sampled by the sampler; (b) a comparator for comparing an output signal from the RF detector with a reference signal; and (c) an integrator for integrating an output of the comparator.

Using such a known RFPA circuit, a constant level of modulated carrier is applied at the RFPA input terminal. The sampler, which may for example comprise a directional coupler, samples the signal at the RFPA output. The RF detector of the controller detects the level of power sampled. The comparator then finds the difference between the level of sampled RFPA power and the reference signal and the result is integrated by the integrator. The signal produced as an output by the integrator is applied as a gain control input voltage to the RFPA at a suitable control input terminal.

A memory associated with the transmitter stores a table of values of the appropriate level of reference signal corresponding to specific values of RF output power level. The table is initially constructed by use of theory and/or experimentation.

There is a major disadvantage with the above known approach. For such a power control arrangement, the RFPA needs to work near its 1-2 dB compression point and not in saturation. If the RFPA is arranged to work in saturation its small signal gain and thus the control loop small signal gain will drop and the control loop will be effectively open. The control loop will not work under such conditions. However, working near the 1-2 dB compression point is not ideal either because the RFPA efficiency is not as good as in saturation. The efficiency decreases as the working point is further from the saturation point (Psat).

Another disadvantage of the above known approach is that the RFPA efficiency will depend on the individual RFPA saturation point and may vary as a result in a given batch of RFPAs. For example, assume that it is required to transmit a power level of 30 dBm and that Psat of a given batch of RFPAs has a statistical distribution of between say 31.5 and 32.5 dBm. It is clear that for a RFPA with Psat of 32.5 dBm the efficiency will be worse than for a RFPA from the same batch with Psat of 31.5 dBm.

The purpose of the present invention is to provide an improved RFPA power control circuit for a RF transmitter, particularly for transmitting a constant power envelope, wherein the above disadvantages are reduced or eliminated.

SUMMARY OF INVENTION

In accordance with a first aspect of the present invention there is provided a RFPA (RF power amplifier) circuit which includes a RFPA, means for applying to the RFPA a supply voltage, means for applying to the RFPA a gain control bias voltage and a feedback control loop for adjusting a voltage applied to the RFPA, the control loop including a sampler for sampling an output of the RFPA, a RF detector for detecting a level of RF power sampled by the sampler, a comparator for comparing an output signal from the RF detector with a reference signal and an integrator for integrating an output signal of the comparator, and characterised in that the control loop further includes a regulator having an output connected to the RFPA to apply an adjustable supply voltage thereto, the regulator having a first input from the integrator and a second input from a supply voltage source and its output providing an output voltage adjusted in relation to an input signal from the integrator.

In contrast to the feedback control loop known in the prior art which provides an output gain control voltage, the control loop in the RFPA circuit according to the invention provides an adjustment to the supply voltage applied to the RFPA.

The means for applying a gain control bias voltage to the RFPA may in one embodiment of the invention apply a substantially constant bias voltage. In another embodiment, the means for applying a gain control bias voltage to the RFPA may apply an adjustable bias voltage. In the latter case, the means for applying a gain control bias signal may beneficially comprise a further feedback loop connected to the integrator, the further feedback loop including a low pass filter. The further feedback loop may have a slower response than the first mentioned feedback loop.

The voltage regulator in the RFPA circuit according to the invention may comprise a high efficiency switching regulator. It may operate by converting the voltage from a voltage source (battery) either (i) in a first mode to a higher voltage; or (ii) in a second mode to a lower voltage. The voltage so regulated is applied as a supply voltage to the RFPA. The regulator output voltage is controlled by an output signal from the comparator, optionally after amplification. Operation of the regulator can be considered to be of the form:

$$V_{BOB} = g \cdot V_{control} \qquad \text{Equation 1}$$

where $V_{BOB}$ is the regulator output voltage, $V_{control}$ is the integrator output voltage and g is the DC gain of the voltage regulator.

The RFPA of the circuit according to the first aspect of the invention may comprise an amplifying device which comprises a solid state amplifying device such as a transistor which may be in bipolar form or in field effect (JFET or MOSFET) form. For example, where a MOSFET (metal oxide semiconductor field effect transistor) is employed, the input signal to be amplified may be applied through an input circuit at a gate electrode of the transistor. The output signal from the transistor may for example be extracted from the drain electrode via an output circuit. Where the transistor is in the form of a bipolar junction transistor, the input signal may applied via an input circuit to the base of the transistor and the output signal may be extracted via an output circuit from the collector of the transistor.

The RFPA circuit according to the first aspect may include two or more amplifying devices. Such devices may be mutually connected in a parallel or a series configuration in a known manner to give a greater output for a given input.

The RFPA circuit according to the first aspect of the present invention may find use in RF transmitters for a number of applications, particularly where a constant envelope RF signal is amplified for transmission. 'Constant envelope' means that the signal has 0 dB peak-to-average ratio. Thus, the input to the RFPA in such a transmitter is at constant power level. The input signal may for example be the output of a frequency modulated voltage controlled oscillator including a phase locked loop (PLL). The output power level depends on the RFPA gain.

In this specification, 'RF' is generally understood to mean frequencies of greater than 10 KHz, e.g. up to 500 GHz. In many cases the RF electromagnetic energy produced in the application will have a frequency of from 100 KHz to 100 GHz.

Where the invention is employed in RF communications transmitters, such transmitters may be incorporated in communications apparatus. For example, the apparatus may, as noted earlier, comprise a mobile station or alternatively a fixed radio station such as a base transceiver station which provides communications to or from MSs in a mobile communications system.

In accordance with a second aspect of the present invention there is provided a RF transmitter including a RFPA circuit according to the first aspect.

In accordance with a third aspect of the present invention there is provided a terminal for use in a RF communication system, the terminal including a transmitter according to the second aspect. The terminal may comprise a fixed or mobile station for use in a mobile communication system. The system may be one whose basic operation is in accordance with industry defined standard procedures, for example a frequency modulation procedure, such as in accordance with the US APCO P25 standard which uses so called C4FM modulation or Legacy FM modulation (regular analogue FM as described for example in TIA/EIA-603-A standard).

Embodiments of the invention beneficially allow the RFPA efficiency to be improved, particularly whilst a high dynamic range power control is achieved. This is beneficial for use in a RF transmitter, particularly a constant envelope RF transmitter. Furthermore, the invention allows a RFPA efficiency to be achieved which is substantially constant and not dependent on the maximum saturation power of the specific RFPA employed. The invention thereby surprisingly allows operation in some applications in which the maximum current drain specification is limited and not achievable using the prior art.

Embodiments of the present invention will now be described by way of example with reference to the accompanying drawings, in which:

DESCRIPTION OF EMBODIMENTS OF THE INVENTION

Figure 1:
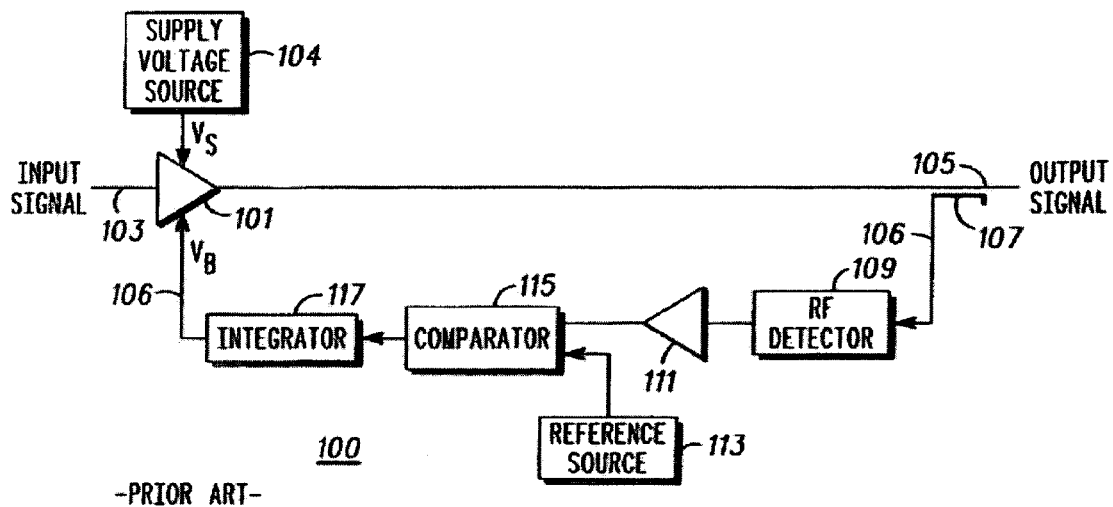
FIG. 1 is a schematic circuit diagram of a prior art RF power amplifier circuit.

FIG. 1 is a schematic circuit diagram of a prior art RFPA circuit 100. A RFPA 101 receives an input modulated RF signal via an input line 103 to be amplified by the RFPA 101. A substantially constant supply voltage $V_S$ is applied to the RFPA 101 from a supply voltage source 104 such as a battery. An amplified RF output signal produced by the RFPA 101 is delivered to an output line. The output signal is sampled by a directional coupler 107. The sampled portion is delivered to a feedback loop 106 which includes a RF detector 109. The detector 109 detects the power level of the sampled portion and produces an output signal accordingly which is amplified by an amplifier 111. The amplified output signal produced by the amplifier 111 is delivered as an input signal to a comparator 115 together with an input signal REF from a reference source 113. The comparator 115 finds the difference between its two input signals and provides an output difference signal to an integrator 117. The integrator 117 integrates the difference signal. An integrated output signal produced by the integrator 117 is a voltage which is applied as a bias control voltage $V_B$ to the RFPA 101. Thus, the bias control voltage $V_B$ is adjusted by the feedback loop 106 and its components according to the detected power level of the output RF signal.

The reference source 113 is in practice a controller which produces a reference signal $V_{REF}$ by use of a look up table held in an associated memory (not shown). The look up table, which may be programmed into the memory in a factory setting procedure following manufacture, consists of suitable reference signals corresponding to different measured power level values. The table may originally be constructed by theoretical analysis and/or experimentation.

The circuit 100 shows the disadvantages described earlier.

Figure 2:
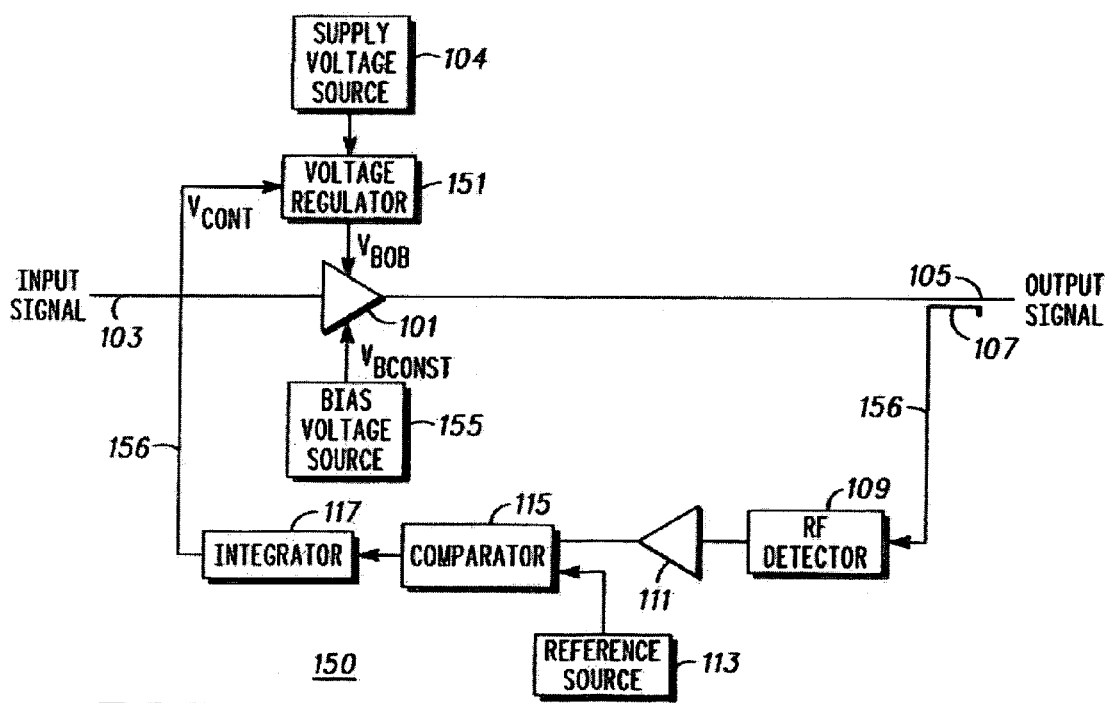
FIG. 2 is a schematic circuit diagram of a RF power amplifier circuit embodying the present invention.

FIG. 2 is a schematic circuit diagram of a RFPA circuit 150 embodying the invention. Components in FIG. 2 having the same reference numerals as corresponding components in FIG. 1 have a similar function and will not be further described. In FIG. 2, an input signal is again applied to a RFPA 101 via the input line 103 and an amplified output signal is again delivered to an output line 105. A regulated supply voltage $V_{BOB}$ is applied to the RFPA 101 by a voltage regulator 151 connected to regulate the output voltage of a supply voltage source (e.g. battery) 104. The voltage regulator 151 receives a control input from a feedback loop 156 which operates in a manner similar to the feedback loop 106 of the circuit 100 of FIG. 1. The feedback loop 156 again includes the directional coupler 107, RF detector 109, amplifier 111, comparator 115, reference source 113, and integrator 117 all operating in the manner described with reference to FIG. 1. However, in the circuit 150, an output control signal $V_{CONT}$ produced by the integrator 117 is applied as an input control voltage to the voltage regulator 151 from the feedback loop 156. The manner in which the supply voltage $V_{BOB}$ is regulated by the regulator 151 is as described earlier by Equation 1. Thus the voltage $V_{BOB}$ produced in this case for application to the RFPA 101 is a supply voltage which is adjusted dynamically by the feedback loop to maintain a constant output power envelope. Furthermore, in the circuit 150, a constant bias voltage $V_{BCONST}$ replaces the variable bias control voltage $V_B$ in FIG. 1.

In practice, the application of the voltages $V_{BOB}$ and $V_{BCONST}$ and application of the input signal and extraction of the output signal are carried out using circuits (not shown) connected to the RFPA 101 which are known per se in the art.

The circuit 100 of FIG. 1 operates while the RFPA 101 is delivering output power in a quasi-linear non-saturation mode as described earlier in the Background of the Invention section. In contrast, the circuit 150 in FIG. 2 operates while the same RFPA 101 is delivering the same output power but in a saturation mode.

The circuit 150 can thereby provide operation with improved efficiency. This has been demonstrated as follows.

For a particular RFPA for use in an APCO HPD (High Performance Data) PCMCIA modem, the following conditions were measured in a circuit of the form of prior art circuit 100:

Output RF signal power level (RFPA level)=31.5 dBm
Input RF signal power level Pin=+1 dBm
Supply voltage ($V_S$)=2.9V
Bias control voltage ($V_B$) (average)=1.6V
RFPA bias current=1.57 A
Efficiency=34.2%

In contrast, for the same RFPA in a circuit of the form of the circuit 150 embodying the invention, the following conditions were measured:

Input RF signal power level=12 dBm
Output RF signal power level (RFPA level)=31.5 dBm
Supply voltage (average) ($V_{BOB}$)=2.34V
Bias voltage (VBCONST)=1.6V
Bias current=1.39 A
Efficiency=43.4%

We can see that for this specific RFPA there is a 27% improvement in efficiency (i.e. 27% of the original efficiency of 34.2%) The improvement can be even greater for power reduction (say by 5 dB) due to a power control activity. For example, when a terminal is required to reduce its power level by 5 dB using the circuit 150 shown in FIG. 2, it will be done by reducing the RFPA supply voltage (reducing the REF 113 voltage). In this way, under power control, the RFPA efficiency will be higher than in the prior art implementation of FIG. 1 where power is reduced by controlling the RFPA gain.

Figure 3:
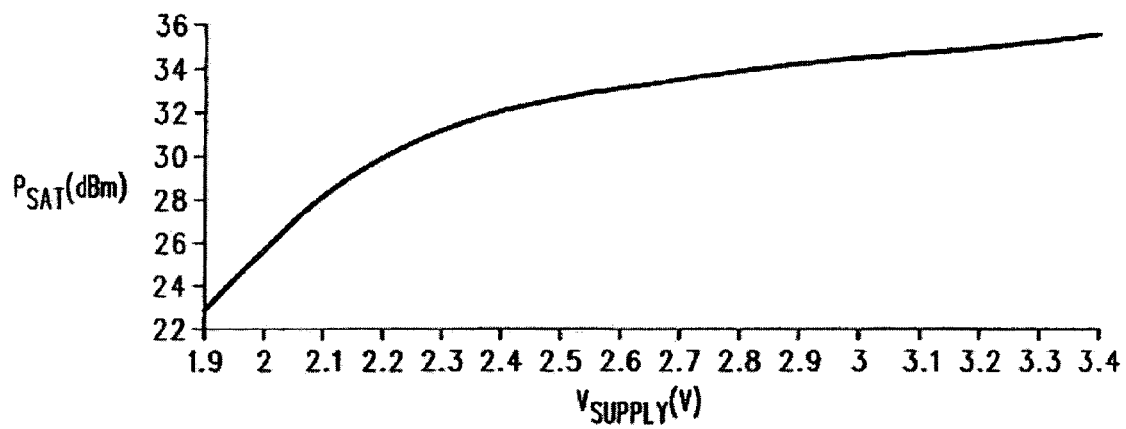
FIG. 3 is a graph of saturation point versus supply voltage for a RF power amplifier used in the circuit of FIG. 2.

FIG. 3 is a graph of saturation point Psat (dBm) versus supply voltage (Vsupply measured in volts) for the RFPA used in this comparative experiment. The graph is monotonic showing that the increase/decrease of the RFPA supply voltage causes respectively an increase/decrease in the RFPA saturated power Psat.

In summary, embodiments of the invention allow the RFPA efficiency to be significantly improved, especially for use in the APCO/HPD PCMCIA radio modem which has a tight specification of maximum current consumption. Such a specification cannot be met by use of the prior art. Also, by using the invention, the RFPA efficiency may be substantially constant and is not dependent on the saturation point of the specific RFPA used since it is used when operating at a saturation power level above the saturation point. High dynamic range power control may also be achieved in a manner to be described later.

Figure 4:
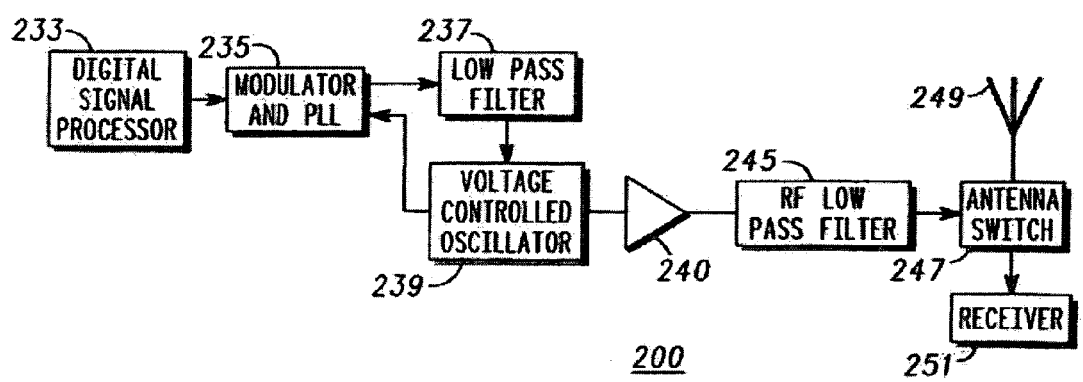
FIG. 4 is a schematic block circuit diagram of a RF transceiver incorporating the amplifier circuit shown in FIG. 1.

In FIG. 4, a transceiver 200 for use in a mobile station of a mobile communications system is shown. A digital signal processor (DSP) 233 supplies digital data to be communicated to a modulator/PLL (phase locked loop) 235. The modulator/PLL 235 applies FM modulation through a low pass filter (LPF) 237 to a voltage controlled oscillator (VCO). A constant power level modulated carrier is applied by the VCO as an input signal to a power amplifier 240. In practice the power amplifier 240 is the same as the RFPA circuit 150 as described earlier. An amplified output signal is produced by the power amplifier 240 and is filtered by a low pass filter 245 which extracts from the output signal harmonics other than the first harmonic. The amplified and filtered output signal from the low pass filter 245 is delivered via a switch 247 (or duplexer) to an antenna 249 which transmits the signal over the air as a RF signal to a remote receiver (not shown). Incoming RF signals may be received by the antenna 249 and diverted by the switch 247 to be processed by a receiver 251 in a known manner.

Operation of the amplifier 240 in the manner of the RFPA circuit 150 described earlier with reference to FIG. 2 provides efficient operation of the transmitter section of the transceiver 200.

The transceiver 200 may be used in a known manner in a wireless terminal, e.g. a mobile station, of a known form, e.g. the form described in WO 03/024140 (with reference to FIG. 4).

Figure 5:
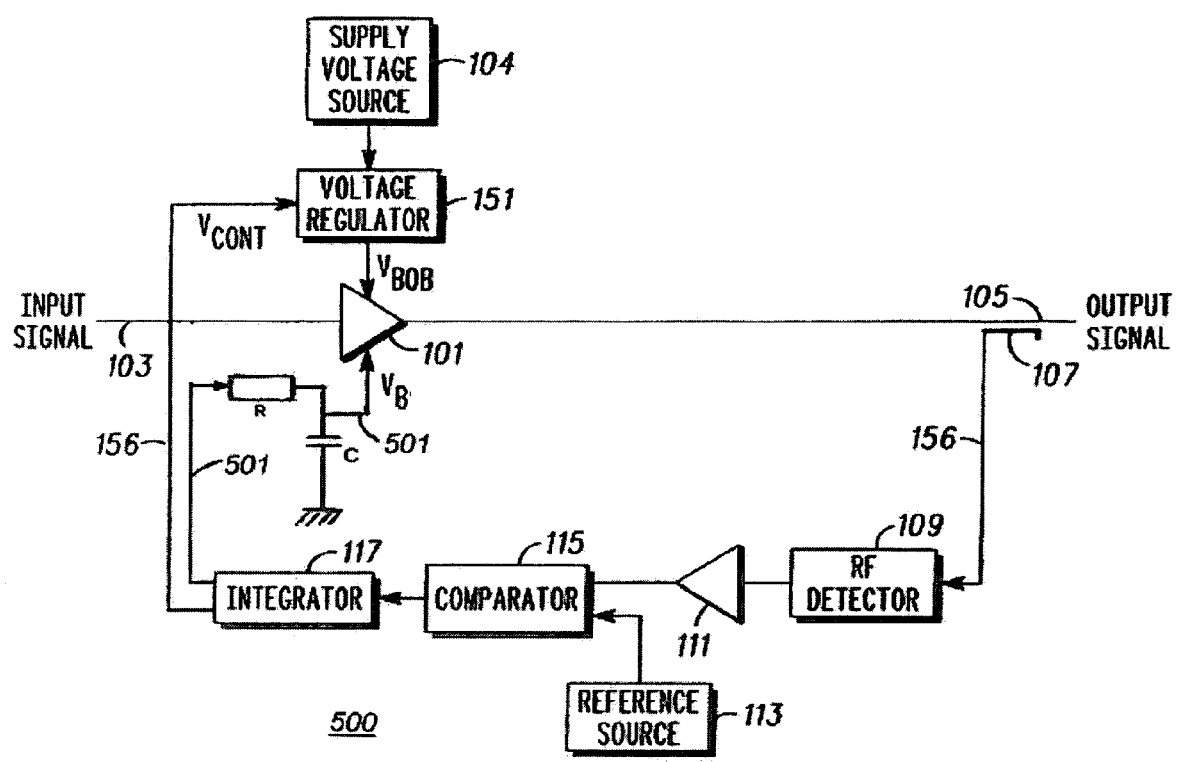
FIG. 5 is a schematic circuit diagram of a further RF power amplifier circuit embodying the present invention.

FIG. 5 is a schematic circuit diagram of a further RF power amplifier circuit 500 embodying the present invention. The circuit 500 is a modified form of the circuit 150 shown in FIG. 2. Components shown in FIG. 5 having the same reference numerals as components shown in FIG. 2 have the same function as those components. In the circuit 500 of FIG. 5 the bias voltage source 155 of the circuit 150 is replaced by a further feedback loop 501 extending from the integrator 117 to the RFPA 101. The feedback loop 501 uses the same output from the integrator 117 as the feedback loop 156. The feedback loop 501 includes a resistor R and a capacitor C connected in respectively in series and in parallel with an input to the RFPA 101 of the feedback loop 501 thereby providing a low pass filter in the feedback loop 501. A voltage $V_B$ is applied by the feedback loop 501 to the RFPA 101. The voltage $V_B$ is applied to a control electrode of the RFPA 101 to provide a dynamically adjusted bias voltage. Any change in the voltage $V_B$ causes a corresponding change in the gain of the RFPA.

Thus, in the circuit 500 of FIG. 5 there are two feedback loops that control output power of the RFPA 101, namely (i) the loop 156 including the voltage regulator 151 to control the supply voltage to the RFPA 101; and (ii) the loop 501 through the RC lowpass filter to control the RFPA gain. The RC lowpass filter of the loop 501 is added so that the loop 501 will be significantly slower than the loop 156. The loop 501 allows a high dynamic range power control (~50 dB) to be achieved where needed. This is beneficial, since the loop 156 alone can only provide around 10 db of power control.

We may illustrate the benefit of the additional feedback loop 501 by example. Assume that the power needs to be reduced by 50 dB in a power control activity. An appropriate reference signal is applied by the reference source 113. First the faster loop 156 reduces the power by the maximum amount it can: 10 dB. Thus the best possible efficiency using this reduced power level is achieved. Then the slower loop 501 reduces the power by an additional 40 dB. In total the power is reduced by 50 dB with optimal efficiency.

The invention claimed is:

1. A radio frequency power amplifier (RFPA) circuit comprising:
   a radio frequency power amplifier;
   a supply voltage source;
   a first feedback loop for adjusting a voltage applied to the radio frequency power amplifier, wherein the first feedback control comprises
      a sampler for sampling an output of the radio frequency power amplifier, a radio frequency detector for detecting a level of radio frequency power sampled by the sampler, a comparator for comparing an output signal from the radio frequency detector with a reference signal, an integrator for integrating an output signal of the comparator, and a voltage regulator having a first input from the integrator and a second input from the supply voltage source and an output connected to the radio frequency power amplifier, the regulator being operable to apply to the radio frequency power amplifier a supply voltage adjusted in response to an input control signal from the integrator; and a second feedback loop including a low pass filter for allowing a high dynamic range power control, the low pass filter having an input from the integrator and an output connected to the radio frequency power amplifier to provide a dynamically adjusted bias voltage causing a corresponding change in gain of the radio frequency power amplifier in response to the input control signal from the integrator.

2. A RFPA circuit according to claim 1 wherein the voltage regulator is operable to convert a supply voltage from the supply voltage source either (i) in a first mode to a higher voltage; or (ii) in a second mode to a lower voltage.

3. A RFPA circuit according to claim 2 wherein in operation the voltage regulator is controlled by an output signal from the comparator, optionally after amplification, such that where this output signal is greater than a given threshold, as measured in the voltage regulator, the first mode is selected and where this output signal is less than the given threshold, as measured in the voltage regulator, the second mode is selected.

4. A RFPA circuit according to claim 2 wherein the voltage regulator is operable such that in each of the first and second modes its output voltage is constant.

5. A RFPA circuit according to claim 1 wherein the RFPA comprises one or more solid state amplifying devices.

6. A RFPA circuit according to claim 1 wherein the sampler comprises a directional coupler.

7. A radio frequency power amplifier (RFPA) transmitter comprising:

a radio frequency power amplifier;

a supply voltage source;

a first feedback loop for adjusting a voltage applied to the radio frequency power amplifier, wherein the first feedback control comprises a sampler for sampling an output of the radio frequency power amplifier, a radio frequency detector for detecting a level of radio frequency power sampled by the sampler, a comparator for comparing an output signal from the radio frequency detector with a reference signal, an integrator for integrating an output signal of the comparator, and a voltage regulator having a first input from the integrator and a second input from the supply voltage source and an output connected to the radio frequency power amplifier, the regulator being operable to apply to the radio frequency power amplifier a supply voltage adjusted in response to an input control signal from the integrator; and a second feedback loop including a low pass filter for allowing a high dynamic range power control, the low pass filter having an input from the integrator and an output connected to the radio frequency power amplifier to provide a dynamically adjusted bias voltage causing a corresponding change in gain of the radio frequency power amplifier in response to the input control signal from the integrator.

8. A RF transmitter according to claim 7 which is operable to transmit a RF modulated signal having a constant envelope.

9. A terminal for use in a RE communication system, the terminal being a fixed or mobile station for use in a mobile communication system and including a transmitter according to claim 8.

10. The RFPA transmitter of claim 7, wherein the voltage regulator is operable to convert a supply voltage from the supply voltage source either (i) in a first mode to a higher voltage; or (ii) in a second mode to a lower voltage.

11. The RFPA transmitter of claim 10, wherein in operation the voltage regulator is controlled by an output signal from the comparator, optionally after amplification, such that where this output signal is greater than a given threshold, as measured in the voltage regulator, the first mode is selected and where this output signal is less than the given threshold, as measured in the voltage regulator, the second mode is selected.

12. The RFPA transmitter of claim 10, wherein the voltage regulator is operable such that in each of the first and second modes its output voltage is substantially constant.

13. The RFPA transmitter according to claim 7, wherein the RFPA comprises one or more solid state amplifying devices.

14. The RFPA transmitter according to claim 7, wherein the sampler comprises a directional coupler.

* * * * *